(12) United States Patent
Ito (10) Patent No.: US 6,424,573 B1
(45) Date of Patent: Jul. 23, 2002

(54) FLOATING GATE FIELD EFFECT TRANSISTOR AND METHOD OF DRIVING THE SAME

(75) Inventor: Hiroshi Ito, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/690,839

(22) Filed: Oct. 18, 2000

(30) Foreign Application Priority Data

Oct. 25, 1999 (JP) ............................................ 11-302332

(51) Int. Cl.[7] .............................................. G11C 16/04
(52) U.S. Cl. ............................. 365/185.26; 365/185.27
(58) Field of Search ....................... 365/185.26, 185.27, 365/185.01, 103

(56) References Cited

U.S. PATENT DOCUMENTS

| | | | | |
|---|---|---|---|---|
| 4,612,629 A | * | 9/1986 | Harari | ........................ 365/185 |
| 5,586,073 A | * | 12/1996 | Hiura et al. | ........... 365/185.01 |
| 5,677,876 A | * | 10/1997 | Tanaka | ................... 365/185.28 |
| 5,694,357 A | * | 12/1997 | Mori | ...................... 365/185.03 |
| 5,739,569 A | * | 4/1998 | Chen | .......................... 257/321 |
| 5,850,091 A | * | 12/1998 | Li et al. | ..................... 257/316 |

* cited by examiner

Primary Examiner—David Nelms
Assistant Examiner—Thong Le
(74) Attorney, Agent, or Firm—Young & Thompson (57) ABSTRACT

The present invention provides a floating gate field effect transistor having a floating gate electrode and a control gate electrode, wherein a low impurity concentration layer of a first conductivity type extends between source and drain regions and in an upper region of a semiconductor region of the first conductivity type, and the low impurity concentration layer is lower in impurity concentration than the semiconductor region, and a channel region is formed in the low impurity concentration layer when the floating gate field effect transistor turns ON.

10 Claims, 13 Drawing Sheets

Electron discharge from floating gate electrode for erasure operation

FIG. 2B  prior art

Electron injection into floating gate electrode for write operation

FIG. 2C  prior art

Read-out operation

FIG. 3   prior art

Distributions of low and high threshold voltages

A : low threshold voltage transistor
B : high threshold voltage transistor

Electron discharge from floating gate electrode for erasure operation

FIG. 5B

Electron injection into floating gate electrode for write operation

FIG. 5C

Read-out operation

FIG. 6

A : low threshold voltage transistor
B : high threshold voltage transistor

FIG. 7

A : low threshold voltage transistor
B : high threshold voltage transistor
- - - - : prior art
——— : invention

ON-resistance characteristic

Source-drain current

Control gate voltage (V)

(−)　　　　　　　　　　　　　　　　　　(+)

- - - - : prior art (read out operation)
——— : invention (read out operation)

FLOATING GATE FIELD EFFECT TRANSISTOR AND METHOD OF DRIVING THE SAME

BACKGROUND OF THE INVENTION

The present invention relates to a semiconductor memory device, and more particularly to a semiconductor memory device having a non-volatile semiconductor memory device such as a flash electrically erasable programmable read only memory.

A floating gate field effect transistor serves as a non-volatile semiconductor memory device which is capable of electrically erasing and programming informations. The floating gate field effect transistor has recently be used as the flash electrically erasable programmable read only memory. The floating gate field effect transistor serving as the flash electrically erasable programmable read only memory has the following structure. Source and drain regions are selectively formed in an upper region of a semiconductor substrate, so that the source and drain regions are separated by a channel region of the semiconductor substrate, whereby the channel region is defined between the source and drain regions. A first gate insulation film is formed on the channel region. A floating gate electrode is provided on the first gate insulation film. A second gate insulation film is provided on a top surface of the floating gate electrode. A control gate electrode is provided on the second gate insulation film.

Usually, the first gate insulation film comprises a single layered structure of a silicon oxide film formed on a main face of the semiconductor substrate, whilst the second gate insulation film comprises a double layered structure of a silicon oxide film and a silicon nitride film.

Information data are stored in the floating gate, wherein charges are accumulated or stored in the floating gate. The information data are written into the floating gate by injecting electrons from the substrate to the floating gate. The information data are erased from the floating gate by discharging electrons from the floating gate to the substrate. The accumulation of electrons or charges in the floating gate changes the threshold voltage of the floating gate field effect transistor. Namely, the threshold voltage of the floating gate field effect transistor is switched between different levels, for example, two levels depending upon the accumulation or discharge of electrons or charges in the floating gate. If the threshold voltage is switched between two levels, then binary digit data are stored in the floating gate.

Figure 1:
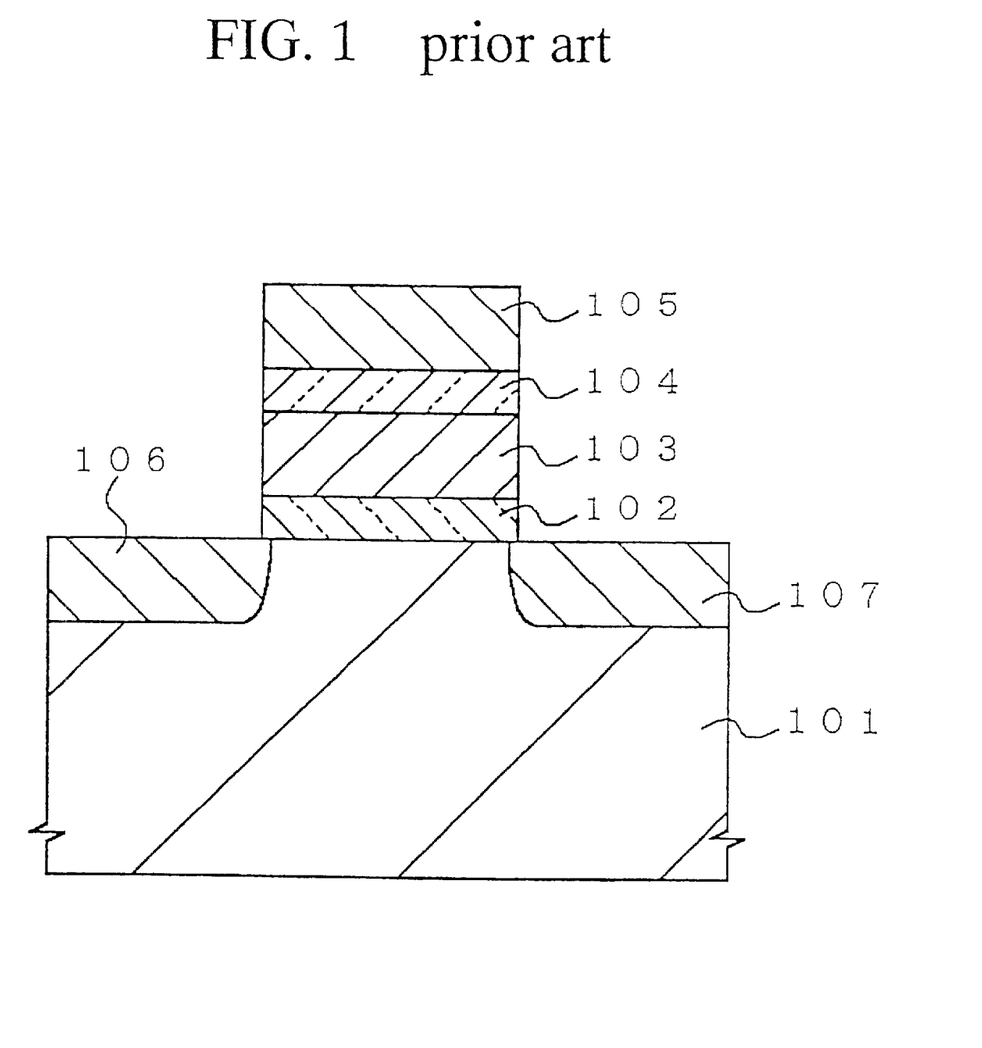
FIG. 1 is a fragmentary cross sectional elevation view illustrative of a conventional floating gate field effect transistor serving as a flash electrically erasable programmable read only memory.

FIG. 1 is a fragmentary cross sectional elevation view illustrative of a conventional floating gate field effect transistor serving as a flash electrically erasable programmable read only memory. N-type source and drain regions 106 and 107 are selectively provided in an upper region of a p-type silicon substrate 101, so that the n-type source and drain regions 106 and 107 are separated by a channel region of the p-type silicon substrate 101, whereby the channel region is defined between the n-type source and drain regions 106 and 107. A first gate insulation film 102 is provided on the channel region. A floating gate electrode 103 is provided on the first gate insulation film 102. A second gate insulation film 104 is provided on a top surface of the floating gate electrode 103. A control gate electrode 105 is provided on the second gate insulation film 104.

Figure 2A:
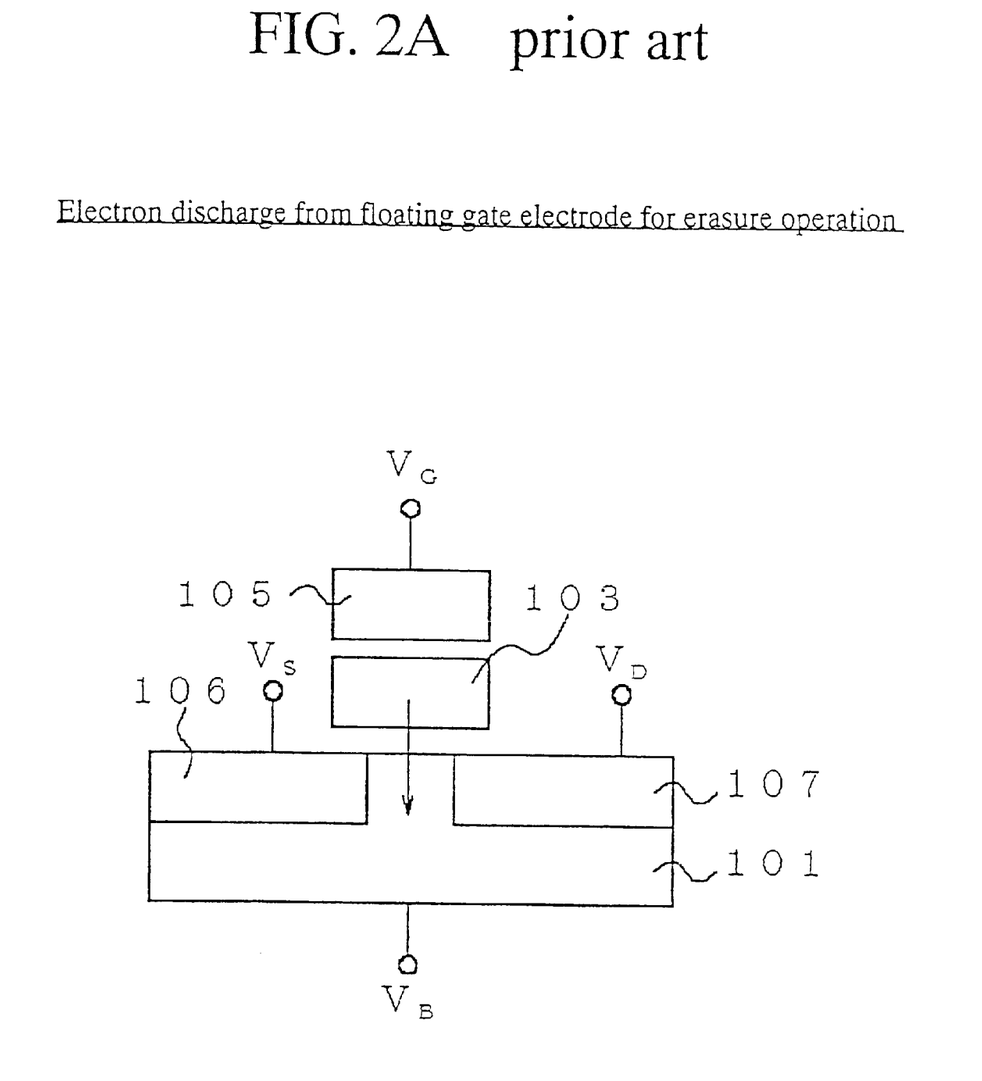
FIG. 2A is a fragmentary schematic cross sectional elevation view illustrate of an erasing operation of the conventional floating gate field effect transistor serving as a flash electrically erasable programmable read only memory shown in FIG. 1.
Figure 2B:
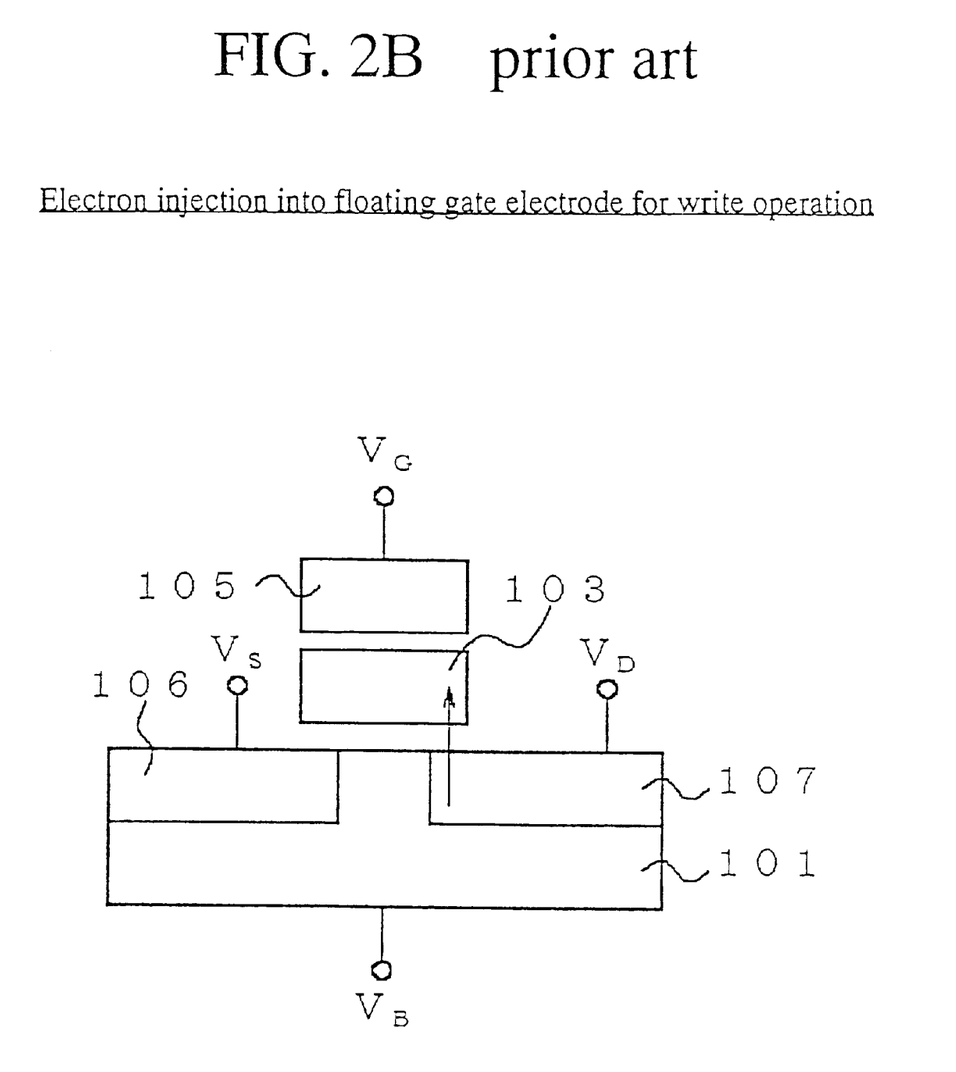
FIG. 2B is a fragmentary schematic cross sectional elevation view illustrate of a writing operation of the conventional floating gate field effect transistor serving as a flash electrically erasable programmable read only memory shown in FIG. 1.
Figure 2C:
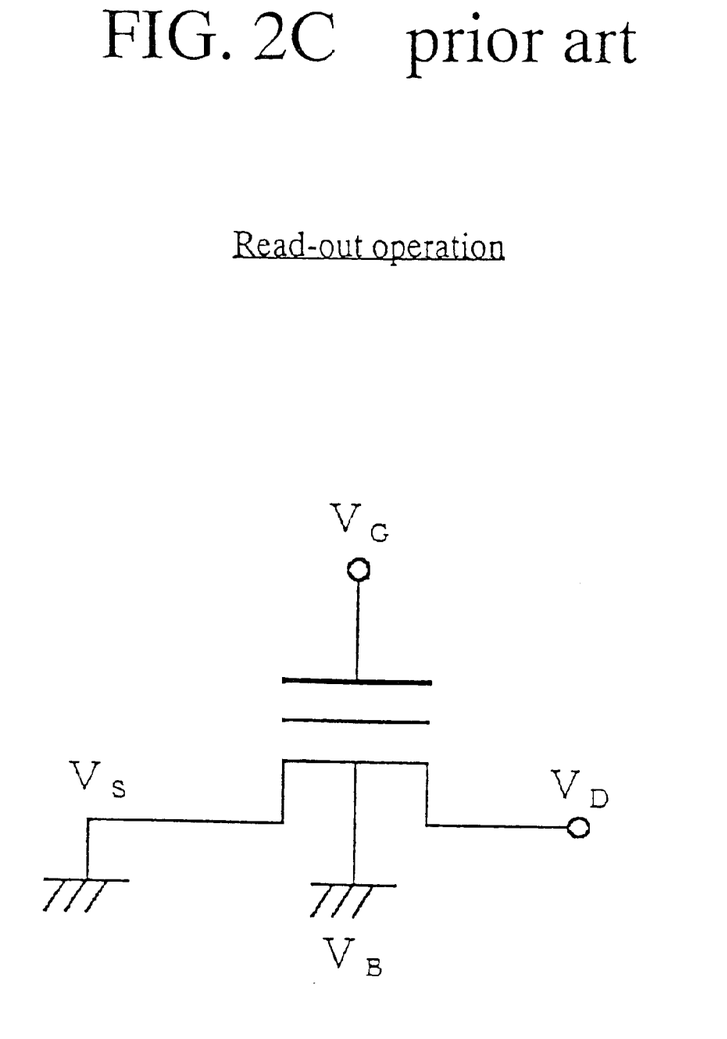
FIG. 2C is a fragmentary schematic cross sectional elevation view illustrate of a read out operation of the conventional floating gate field effect transistor serving as a flash electrically erasable programmable read only memory shown in FIG. 1.
Figure 3:
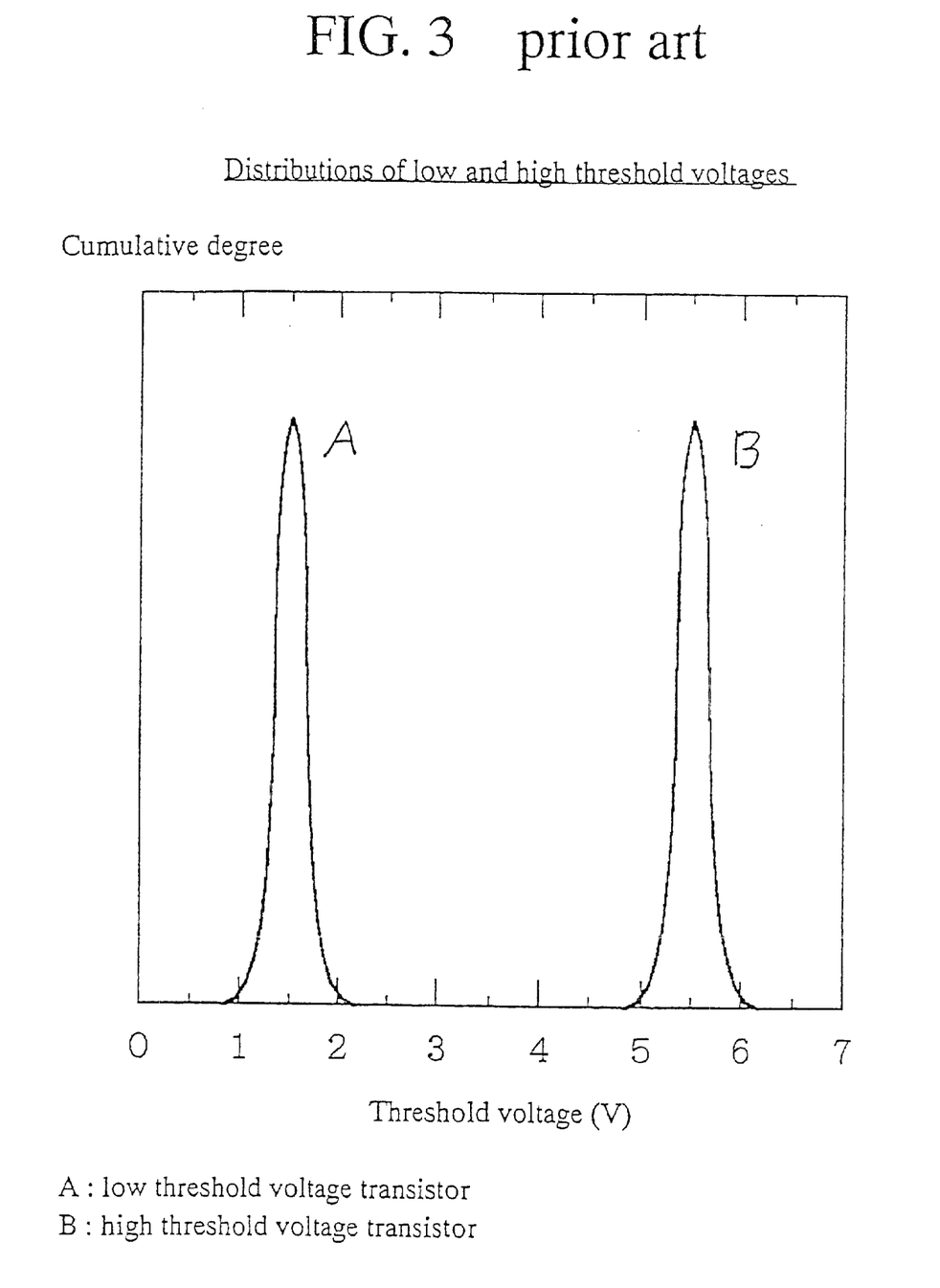
FIG. 3 is a diagram illustrative of variations of a cumulative degree over threshold voltage of a low threshold voltage transistor and a high threshold voltage transistor.

FIG. 2A is a fragmentary schematic cross sectional elevation view illustrate of an erasing operation of the conventional floating gate field effect transistor serving as a flash electrically erasable programmable read only memory shown in FIG. 1. FIG. 2B is a fragmentary schematic cross sectional elevation view illustrate of a writing operation of the conventional floating gate field effect transistor serving as a flash electrically erasable programmable read only memory shown in FIG. 1. FIG. 2C is a fragmentary schematic cross sectional elevation view illustrate of a read out operation of the conventional floating gate field effect transistor serving as a flash electrically erasable programmable read only memory shown in FIG. 1. FIG. 3 is a diagram illustrative of variations of a cumulative degree over threshold voltage of a low threshold voltage transistor and a high threshold voltage transistor.

With reference to FIG. 2A, the erasure operation of the floating gate field effect transistor will be described. A control voltage Vg of the control gate electrode 105 is fixed at about −20V. A substrate voltage of the substrate 101 is fixed at the ground potential. Electrons are discharged from the floating gate electrode 103 and travel as a Fowler Nordheim tunnel current through the first gate insulation film 102 to the substrate 101. During the erasure operation, the source and drain regions 106 and 107 remain in the floating state. As shown in FIG. 3, the floating gate field effect transistor during the erasure operation may be considered to be a low threshold voltage floating gate field effect transistor having a low threshold voltage of about 1–2V. In FIG. 3, a few times verifying operations are carried out for the electron discharge from the floating gate electrode 103. This verifying operation is like that if any excess discharge of electrons from the floating gate electrode is caused, then electrons are injected into the floating gate electrode so as to adjust or control the amount of electrons in the floating gate electrode, thereby to reduce a variation in threshold voltage of the floating gate field effect transistor.

The write operation of the above conventional floating gate field effect transistor will be described with reference to FIG. 2B. A source voltage Vs of the source region 106 is fixed at the ground potential. A drain voltage Vd of the drain region 107 is fixed at a plus potential. A control gate electrode 105 is applied with a high voltage Vg to form an n-channel between the source and drain regions 106 and 107, whereby electrons as carriers flow from the source region 106 through the n-channel to the drain region 107. Since the high voltage Vg applied to the control gate electrode 105 is higher than the drain voltage Vd of the drain region 107, the potential of the floating gate electrode 103 is an intermediate level between the high voltage Vg applied to the control gate electrode 105 and the drain voltage Vd of the drain region 107, whereby an electric field is applied across the first gate insulation film 102 between the floating gate electrode 103 and the drain region 107. As a result, the electrons penetrate the first gate insulation film 102 and are injected into the floating gate electrode 103 as hot electrons. As shown in FIG. 3, the floating gate field effect transistor during the write operation may be considered to be a high threshold voltage floating gate field effect transistor having a high threshold voltage of about 5–6V.

The read out operation of the floating gate field effect transistor will be described with reference to FIG. 2C. the source voltage Vs of the source region 106 is fixed at the ground voltage. The drain voltage Vd of the drain region 107 is fixed at a predetermined positive voltage. The substrate voltage VB of the substrate 101 is fixed at the ground voltage. The control gate voltage Vg which has an intermediate level between the low and high levels shown in FIG. 3 is applied to the control gate electrode 105, whereby if the floating gate electrode 103 has been charged positively, then the floating gate field effect transistor turns ON, whilst if the floating gate electrode 103 has been charged negatively, then the floating gate field effect transistor turns OFF. As a result, binary digit data "0" and "1" are read out.

In accordance with the conventional floating gate field effect transistor, after either the erasure operation or the write operation has been carried out, the threshold voltage to the control gate electrode is positive. Namely, the floating gate field effect transistor is designed to be of enhancement type after either the erasure or write operation has been carried out.

If the floating gate field effect transistor becomes enhancement type in the erasure state, then this makes it difficult to reduce an ON resistance of the floating gate field effect transistor. Particularly, the semiconductor memory device having the floating gate field effect transistor needs enhancement driving ability of the floating gate field transistor and reduced ON resistance. The above conventional floating gate field effect transistor is inapplicable to the semiconductor memory device that needs enhanced driving ability and reduced ON resistance.

In the above circumstances, it had been required to develop a novel floating gate field effect transistor free from the above problem.

SUMMARY OF THE INVENTION

Accordingly, it is an object of the present invention to provide a novel floating gate field effect transistor free from the above problems.

It is a further object of the present invention to provide a novel floating gate field effect transistor suitable for application to an advanced semiconductor memory device.

It is further more object of the present invention to provide a novel floating gate field effect transistor suitable for application to an advanced logic semiconductor device.

It is a still further object of the present invention to provide a novel floating gate field effect transistor improved in driving ability thereof.

It is yet a further object of the present invention to provide a novel floating gate field effect transistor reduced in ON-resistance thereof.

It is another object of the present invention to provide a novel floating gate field effect transistor improved in holding time for holding charges in the floating gate thereof.

It is still another object of the present invention to provide a novel floating gate field effect transistor improved in acceptable cyclic numbers of writing and erasing operations.

The present invention provides a floating gate field effect transistor having a floating gate electrode and a control gate electrode, wherein a low impurity concentration layer of a first conductivity type extends between source and drain regions and in an upper region of a semiconductor region of the first conductivity type, and the low impurity concentration layer is lower in impurity concentration than the semiconductor region, and a channel region is formed in the low impurity concentration layer when the floating gate field effect transistor turns ON.

The present invention also provides a method of driving a floating gate field effect transistor having a floating gate electrode and a control gate electrode, wherein the floating gate field effect transistor is placed in a depletion type state for discharging electrons from the floating gate electrode, wherein the floating gate field effect transistor is applied with a back-bias for carrying out a read-out operation, and wherein the floating gate field effect transistor is placed in a depletion type state during a neutral state free of either electron discharge from the floating gate electrode or electron injection into the floating gate electrode.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DESCRIPTION OF THE PREFERRED EMBODIMENT

The first present invention provides a floating gate field effect transistor having a floating gate electrode and a control gate electrode, wherein a low impurity concentration layer of a first conductivity type extends between source and drain regions and in an upper region of a semiconductor region of the first conductivity type, and the low impurity concentration layer is lower in impurity concentration than the semiconductor region, and a channel region is formed in the low impurity concentration layer when the floating gate field effect transistor turns ON.

It is preferable that the semiconductor region comprises a semiconductor well region formed in a semiconductor substrate, and the source and drain regions are selectively provided in the semiconductor well region.

It is also preferable that the low impurity concentration layer is in the range of impurity concentration from $1/10$ to $1/100$ of the semiconductor region.

It is also preferable that the low impurity concentration layer has a thickness in the range of 100 nanometers to 300 nanometers.

It is also preferable that the floating gate field effect transistor is placed in a depletion type state for discharging electrons from the floating gate electrode.

It is also preferable that the floating gate field effect transistor is applied with a back-bias for carrying out a read-out operation.

It is also preferable that the floating gate field effect transistor is placed in a depletion type state during a neutral state free of either electron discharge from the floating gate electrode or electron injection into the floating gate electrode.

In accordance with the third present invention, the low impurity concentration layer is formed in the well region, wherein the low impurity concentration layer is lower in impurity concentration than the well-region, so that a channel region is formed in the low impurity concentration layer when the novel floating gate field effect transistor turns ON. The novel floating gate field effect transistor is placed in the state of depletion type in an operation of discharging electrons from the floating gate electrode, and also the novel floating gate field effect transistor is applied with the back-bias for carrying out the read-out operation, so that the driving ability of the novel floating gate field effect transistor is improved and the ON-resistance of the novel floating gate field effect transistor is reduced. The improvement in the driving ability of the novel floating gate field effect transistor makes the driving ability of the novel floating gate field effect transistor more suitable for application to the advanced logic semiconductor devices. In the neutral state free of either electron discharge from the floating gate electrode or electron injection into the floating gate electrode, the novel floating gate field effect transistor is placed in the state of depletion type, whereby the holding characteristic for holding charges in the floating gate electrode is improved. Also cyclic characteristics of the electron discharge from the floating gate electrode and electron injection into the floating gate electrode are improved.

The second present invention provides a floating gate field effect transistor comprising: a semiconductor substrate of a first conductivity type; a well region of a second conductivity type being selectively formed in the semiconductor substrate; source and drain regions of the first conductivity type being selectively formed in the well region; and a low impurity concentration layer of the first conductivity type extending between source and drain regions and in an upper region of the well region of the second conductivity type, wherein the low impurity concentration layer is lower in impurity concentration than the semiconductor region, and a channel region is formed in the low impurity concentration layer when the floating gate field effect transistor turns ON.

It is preferable that the semiconductor region comprises a semiconductor well region formed in a semiconductor substrate, and the source and drain regions are selectively provided in the semiconductor well region.

It is also preferable that the low impurity concentration layer is in the range of impurity concentration from $1/10$ to $1/100$ of the semiconductor region.

It is also preferable that the low impurity concentration layer has a thickness in the range of 100 nanometers to 300 nanometers.

It is also preferable that the floating gate field effect transistor is placed in a depletion type state for discharging electrons from the floating gate electrode.

It is also preferable that the floating gate field effect transistor is applied with a back-bias for carrying out a read-out operation.

It is also preferable that the floating gate field effect transistor is placed in a depletion type state during a neutral state free of either electron discharge from the floating gate electrode or electron injection into the floating gate electrode.

In accordance with the third present invention, the low impurity concentration layer is formed in the well region, wherein the low impurity concentration layer is lower in impurity concentration than the well-region, so that a channel region is formed in the low impurity concentration layer when the novel floating gate field effect transistor turns ON. The novel floating gate field effect transistor is placed in the state of depletion type in an operation of discharging electrons from the floating gate electrode, and also the novel floating gate field effect transistor is applied with the back-bias for carrying out the read-out operation, so that the driving ability of the novel floating gate field effect transistor is improved and the ON-resistance of the novel floating gate field effect transistor is reduced. The improvement in the driving ability of the novel floating gate field effect transistor makes the driving ability of the novel floating gate field effect transistor more suitable for application to the advanced logic semiconductor devices. In the neutral state free of either electron discharge from the floating gate electrode or electron injection into the floating gate electrode, the novel floating gate field effect transistor is placed in the state of depletion type, whereby the holding characteristic for holding charges in the floating gate electrode is improved. Also cyclic characteristics of the electron discharge from the floating gate electrode and electron injection into the floating gate electrode are improved.

The third present invention provides a method of driving a floating gate field effect transistor having a floating gate electrode and a control gate electrode, wherein the floating gate field effect transistor is placed in a depletion type state for discharging electrons from the floating gate electrode, wherein the floating gate field effect transistor is applied with a back-bias for carrying out a read-out operation, and wherein the floating gate field effect transistor is placed in a depletion type state during a neutral state free of either electron discharge from the floating gate electrode or electron injection into the floating gate electrode.

In accordance with the third present invention, the low impurity concentration layer is formed in the well region, wherein the low impurity concentration layer is lower in impurity concentration than the well-region, so that a channel region is formed in the low impurity concentration layer when the novel floating gate field effect transistor turns ON. The novel floating gate field effect transistor is placed in the state of depletion type in an operation of discharging electrons from the floating gate electrode, and also the novel floating gate field effect transistor is applied with the back-bias for carrying out the read-out operation, so that the driving ability of the novel floating gate field effect transistor is improved and the ON-resistance of the novel floating gate field effect transistor is reduced. The improvement in the driving ability of the novel floating gate field effect transistor makes the driving ability of the novel floating gate field effect transistor more suitable for application to the advanced logic semiconductor devices. In the neutral state free of either electron discharge from the floating gate electrode or electron injection into the floating gate electrode, the novel floating gate field effect transistor is placed in the state of depletion type, whereby the holding characteristic for holding charges in the floating gate electrode is improved. Also cyclic characteristics of the electron discharge from the floating gate electrode and electron injection into the floating gate electrode are improved.

Figure 4:
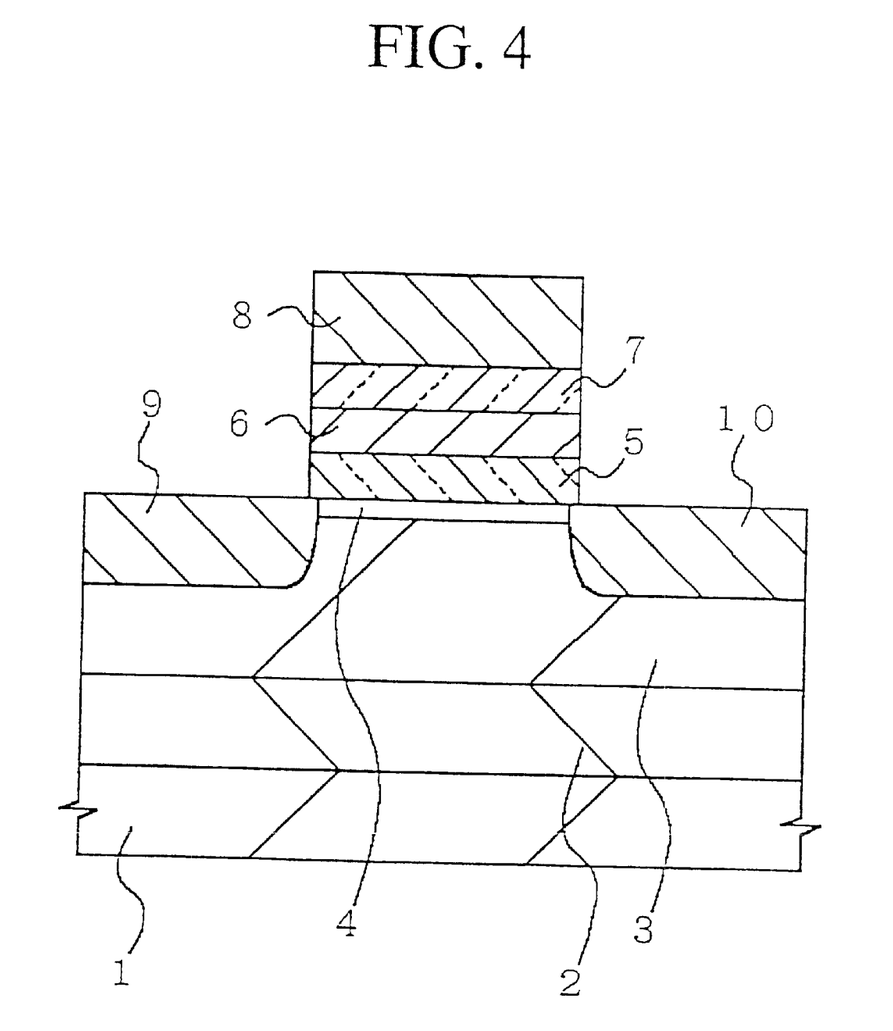
FIG. 4 is a fragmentary cross sectional elevation view illustrative of a novel floating gate field effect transistor serving as a flash electrically erasable programmable read only memory in a first embodiment in accordance with the present invention.

A first embodiment according to the present invention will be described in detail with reference to the drawings. FIG. 4 is a fragmentary cross sectional elevation view illustrative of a novel floating gate field effect transistor serving as a flash electrically erasable programmable read only memory in a first embodiment in accordance with the present invention. An n-well region 2 is provided on a p-type silicon substrate 1. A p-well region 3 is provided in an upper region of the n-well region 2. The p-well region 3 has an impurity concentration of 8E17 atoms/cm3. A p-type low impurity layer 4 is formed on an upper region of the p-well region 3. The p-type low impurity layer 4 is lower in impurity concentration than the p-well region 3. It is preferable that the impurity concentration of the p-type low impurity layer 4 is in the range of 1/10 to 1/100 of the impurity concentration of the p-well region 3. The p-type low impurity layer 4 has an impurity concentration of about 1E16 atoms/cm3. The p-type low impurity layer 4 has a thickness in the range of 100–300 nanometers. N-type source and drain regions 9 and 10 are selectively provided in an upper region of the p-well region 3, so that the n-type source and drain regions 9 and 10 define the p-type low impurity layer 4, whereby a channel region defined between the n-type source and drain regions 9 and 10 is formed in the p-type low impurity layer 4. A first gate insulation film 5 is provided on the p-type low impurity layer 4. The first gate insulation film 5 has a thickness of about 10 nanometers. A floating gate electrode 6 is provided on the first gate insulation film 5. The floating gate electrode 6 comprises a polysilicon film containing phosphorous or arsenic as an impurity. The floating gate electrode 6 has a thickness of about 150 nanometers. A second gate insulation film 7 is provided on a top surface of the floating gate electrode 6. The second gate insulation film 7 comprises laminations of a silicon oxide film having a thickness of about 5 nanometers and a silicon nitride film having a thickness of about 5 nanometers, wherein the silicon oxide film is laminated on the floating gate electrode 6 and the silicon nitride film is laminated on the silicon oxide film. The thickness of the second gate insulation film 7 may be converted to 15 nanometers of the single silicon oxide film. A control gate electrode 8 is provided on the second gate insulation film 7. The control gate electrode 8 comprises a tungsten polycide.

Figure 5A:
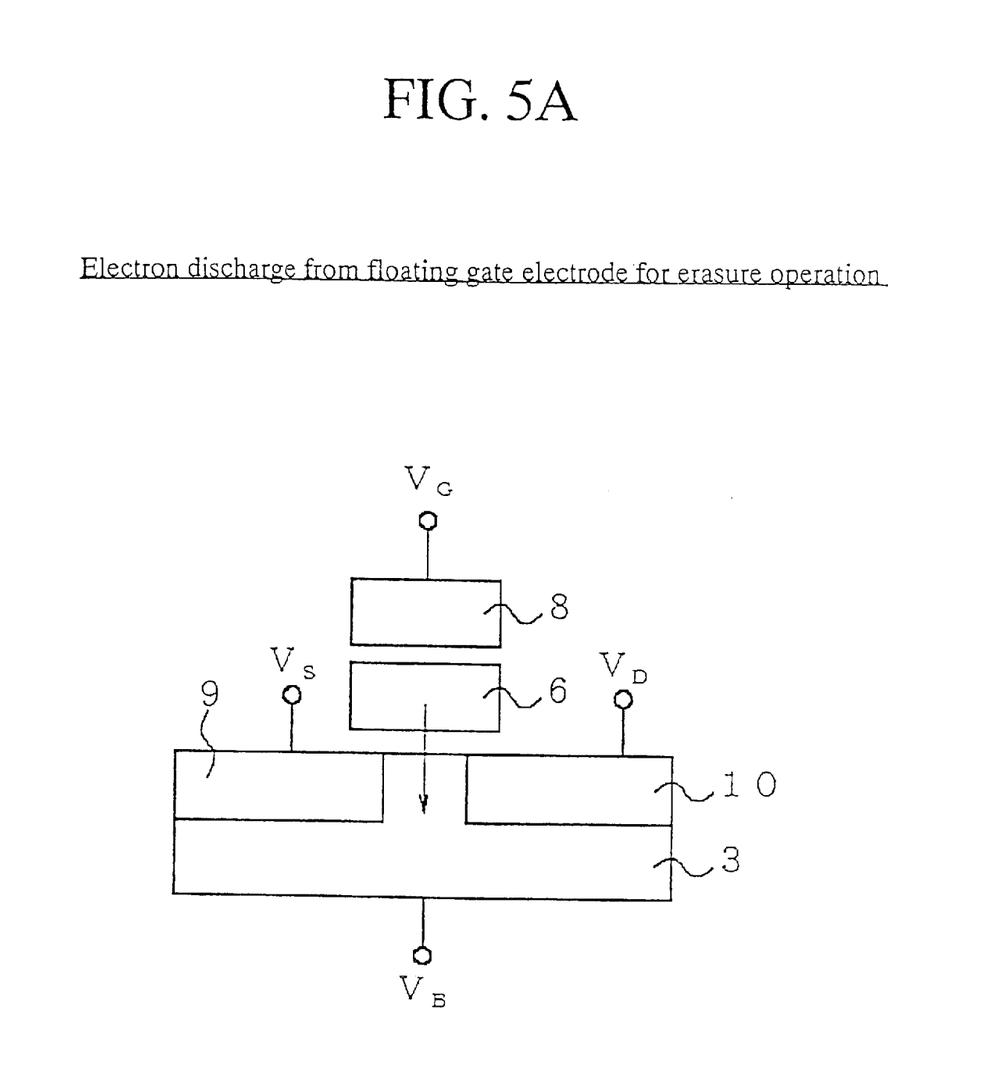
FIG. 5A is a fragmentary schematic cross sectional elevation view illustrate of an erasing operation of the novel floating gate field effect transistor serving as a flash electrically erasable programmable read only memory shown in FIG. 4 in a first embodiment in accordance with the present invention.
Figure 5B:
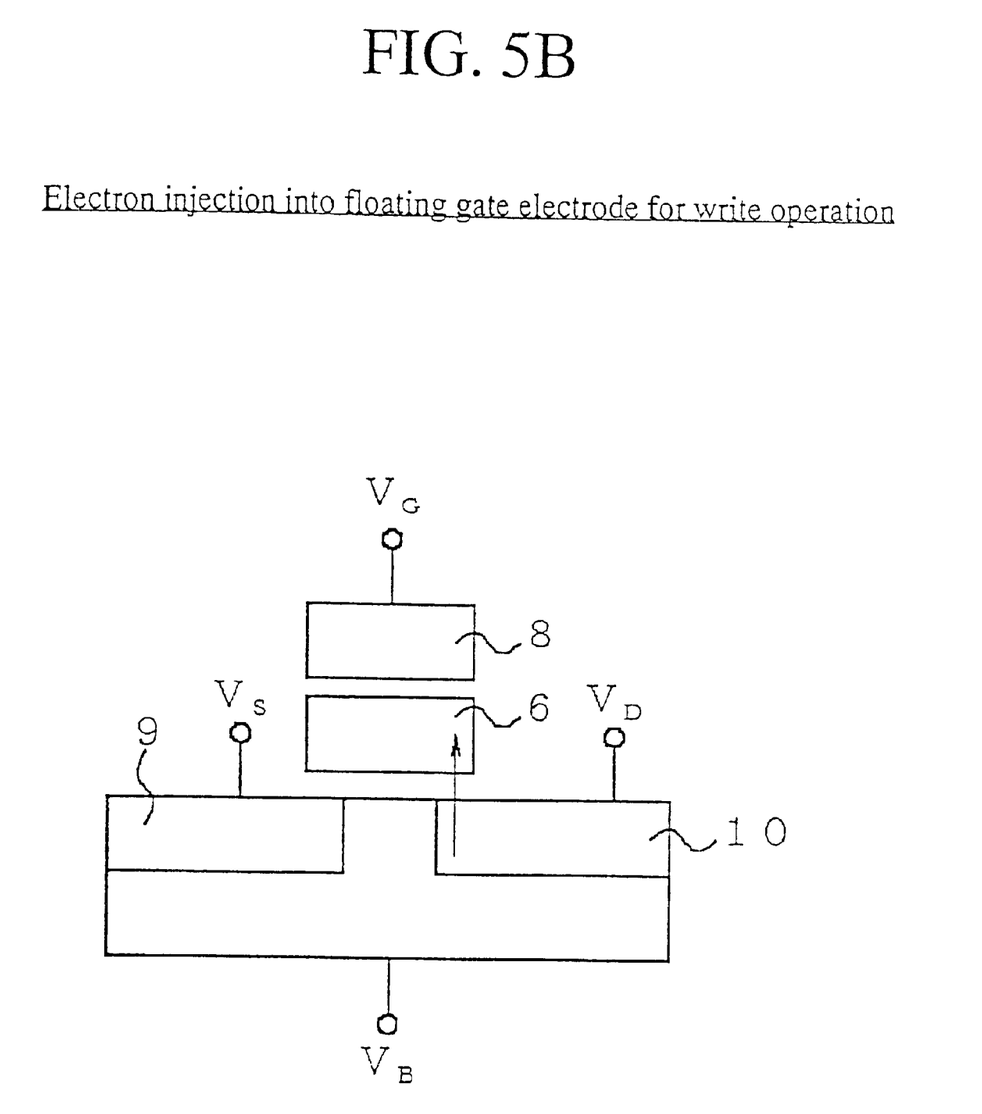
FIG. 5B is a fragmentary schematic cross sectional elevation view illustrate of a writing operation of the novel floating gate field effect transistor serving as a flash electrically erasable programmable read only memory shown in FIG. 4 in a first embodiment in accordance with the present invention.
Figure 5C:
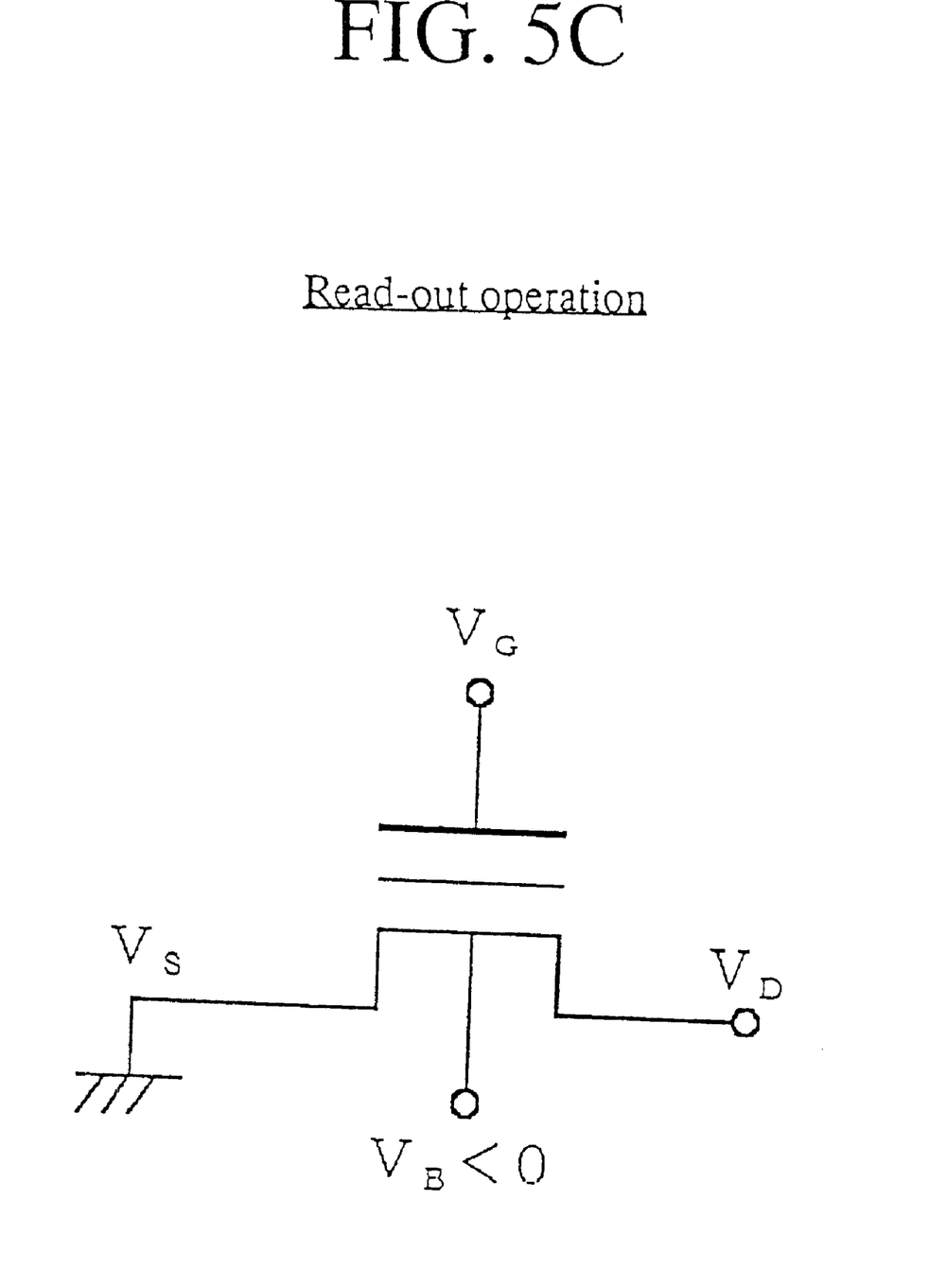
FIG. 5C is a fragmentary schematic cross sectional elevation view illustrate of a read out operation of the novel floating gate field effect transistor serving as a flash electrically erasable programmable read only memory shown in FIG. 4 in a first embodiment in accordance with the present invention.
Figure 6:
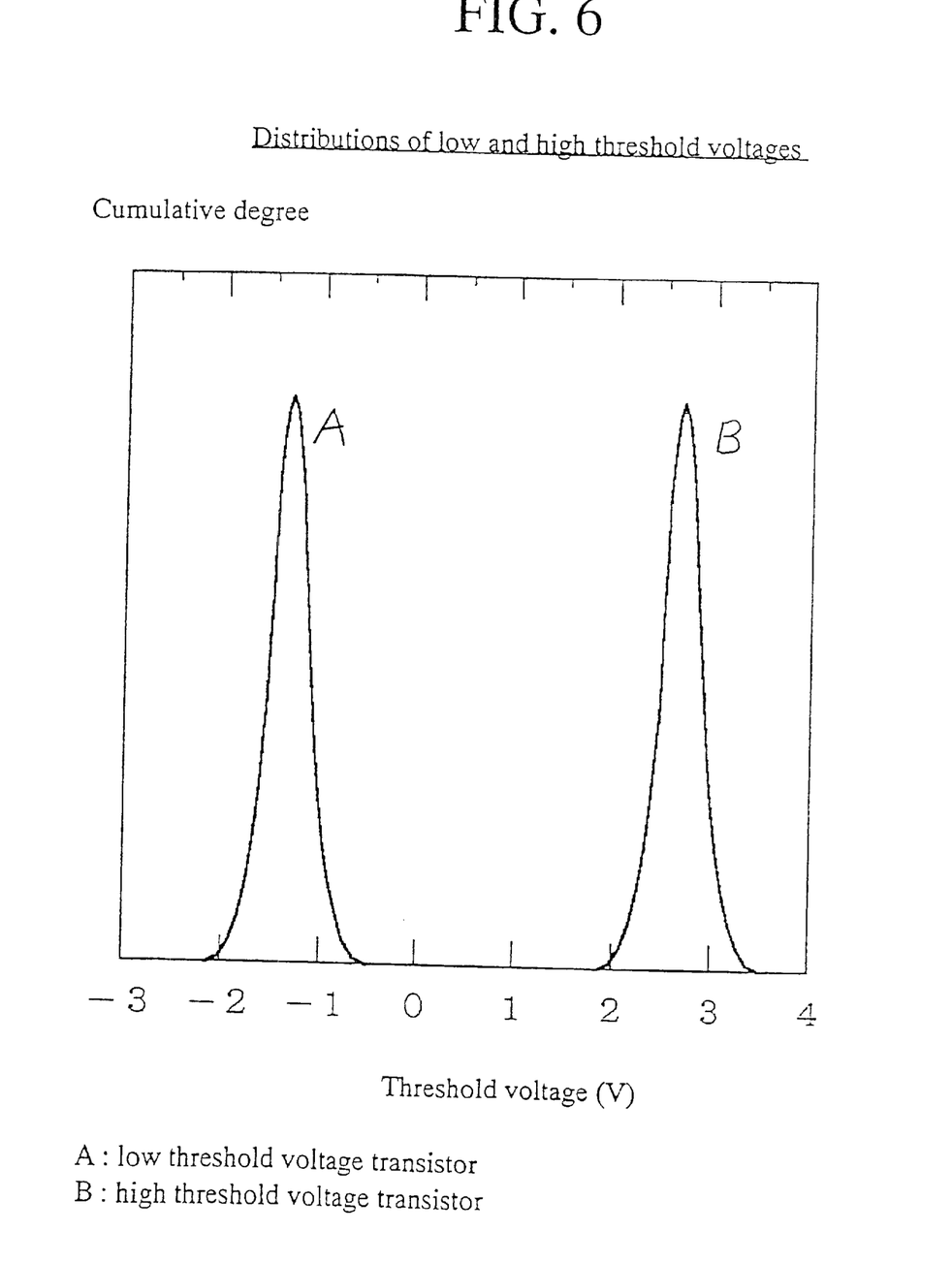
FIG. 6 is a diagram illustrative of variations of a cumulative degree over threshold voltage of a low threshold voltage transistor and a high threshold voltage transistor in a first embodiment in accordance with the present invention.
Figure 7:
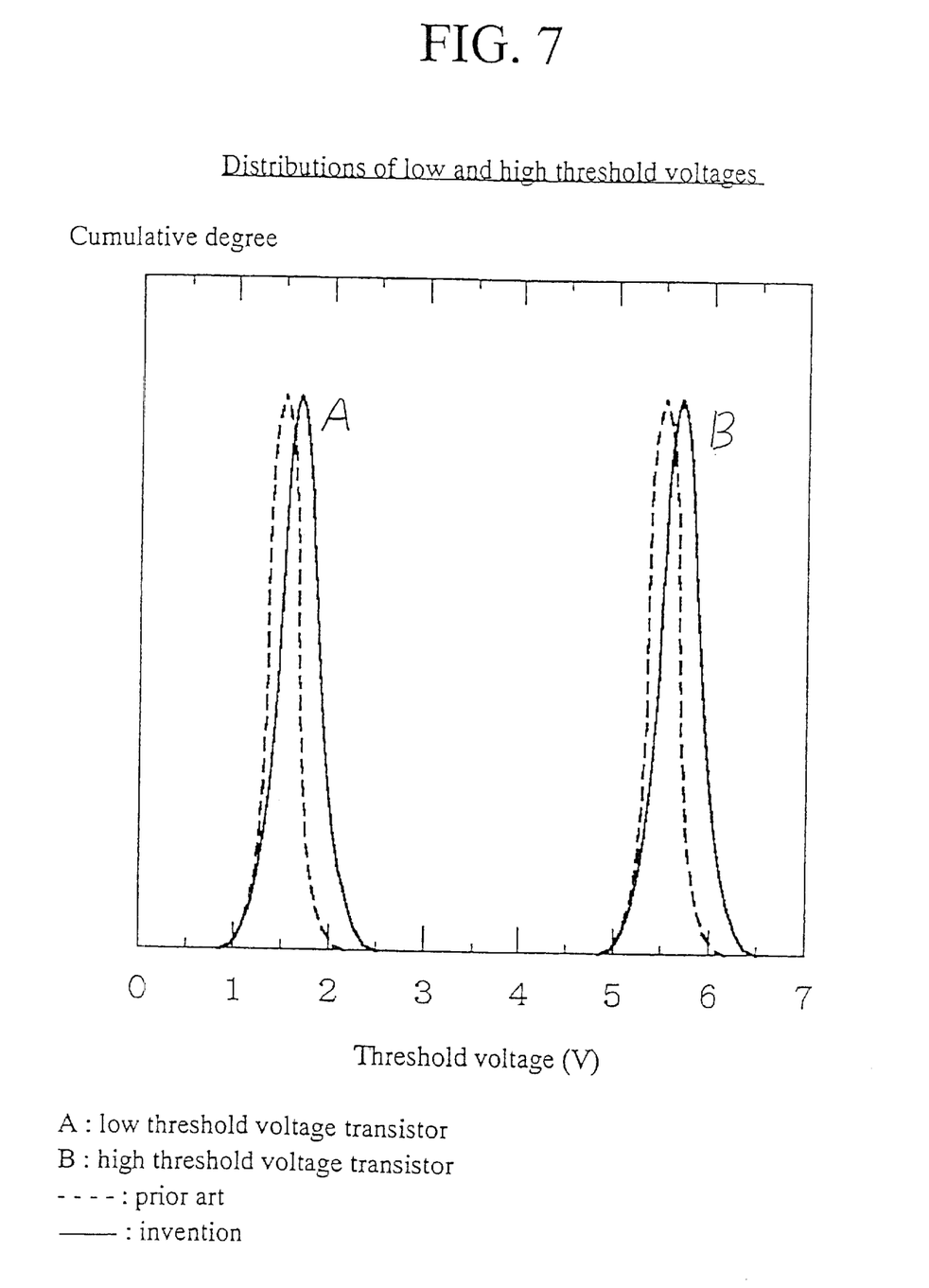
FIG. 7 is a diagram illustrative of variations of a cumulative degree over threshold voltage of a low threshold voltage transistor and a high threshold voltage transistor in the prior art and in a first embodiment in accordance with the present invention.

FIG. 5A is a fragmentary schematic cross sectional elevation view illustrate of an erasing operation of the novel floating gate field effect transistor serving as a flash electrically erasable programmable read only memory shown in FIG. 4 in a first embodiment in accordance with the resent invention. FIG. 5B is a fragmentary schematic cross sectional elevation view illustrate of a writing operation of the novel floating gate field effect transistor serving as a flash electrically erasable programmable read only memory shown in FIG. 4 in a first embodiment in accordance with the present invention. FIG. 5C is a fragmentary schematic cross sectional elevation view illustrate of a read out operation of the novel floating gate field effect transistor serving as a flash electrically erasable programmable read only memory shown in FIG. 4 in a first embodiment in accordance with the present invention. FIG. 6 is a diagram illustrative of variations of a cumulative degree over threshold voltage of a low threshold voltage transistor and a high threshold voltage transistor in a first embodiment in accordance with the present invention. FIG. 7 is a diagram illustrative of variations of a cumulative degree over threshold voltage of a low threshold voltage transistor and a high threshold voltage transistor in the prior art and in a first embodiment in accordance with the present invention.

With reference to FIG. 5A, the erasure operation of the floating gate field effect transistor will be described. A control gate voltage VG of the control gate electrode 8 is fixed at about −20V A substrate voltage Vb of the silicon substrate 1 or a well region voltage of the p-well region 3 is fixed at the ground potential. Electrons are discharged from the floating gate electrode 6 and travel as a Fowler Nordheim tunnel current through the first gate insulation film 5 to the p-well region 3. During the erasure operation, the source and drain regions 9 and 10 remain in the floating state.

In accordance with the present invention, the above discharge of the electrons from the floating gate electrode 6 causes that the threshold voltage of the floating gate field effect transistor becomes negative when the substrate voltage Vg is zero, whereby the floating gate field effect transistor becomes depletion type.

By contrast to the present invention, in accordance with the conventional floating gate field effect transistor, after the electron discharge was caused, then the threshold voltage remains positive. As shown in FIG. 6, the floating gate field effect transistor may be considered to be a low threshold voltage floating gate field effect transistor having a low threshold voltage of about −2 to −1V. The frequency of the threshold voltage after the erasure operation was made represents on the vertical axis, provided that the substrate voltage of the silicon substrate 1 or the p-well region 5 is fixed at the ground voltage.

The write operation of the above novel floating gate field effect transistor will be described with reference to FIG. 5B.

A source voltage Vs of the source region 9 is fixed at the ground potential. A drain voltage Vd of the drain region 10 is fixed at a plus potential. A control gate electrode 8 is applied with a high voltage Vg to form an n-channel in the low impurity-type layer 4 between the source and drain regions 9 and 10, whereby electrons as carriers flow from the source region 9 through the n-channel to the drain region 10. Since the high voltage Vg applied to the control applied to the control gate electrode 8 is higher than the drain voltage Vd of the drain region 10, the potential of the floating gate electrode 6 is an intermediate level between the high voltage Vg applied to the control gate electrode 8 and the drain voltage Vd of the drain region 10, whereby an electric field is applied across the first gate insulation film 5 between the floating gate electrode 6 and the drain region 10. As a result, the electrons penetrate the first gate insulation film 5 and are injected into the floating gate electrode 6 as hot electrons. As shown in FIG. 6, the floating gate field effect transistor during the write operation may be considered to be a high threshold voltage floating gate field effect transistor having a high threshold voltage of about 2–3V.

The above novel floating gate field effect transistor is designed so that when the floating gate field effect transistor is placed in a neutral state, a threshold voltage or a neutral threshold voltage is negative. This means that the floating gate field effect transistor is the depletion type. In the above case, the neutral threshold voltage of the floating gate field effect transistor is set at about –0.1V. The holding time of the information or informational charges stored in the floating gate electrode is improved.

The read out operation of the floating gate field effect transistor will be described with reference to FIG. 5C. The source voltage Vs of the source region 9 is fixed at the ground voltage. The drain voltage Vd of the drain region 10 is fixed at a predetermined positive voltage. A back bias is applied to the substrate 1, so that the substrate voltage VB of the substrate 1 or the p-well region 3 is fixed at the negative voltage. As described above, the substrate voltage Vs of the substrate 1 or the p-well region 3 is set at the negative potential, for example, at about –3V, so that the low and high threshold voltages shown in FIG. 6 are also increased or shifted in positive direction. Namely, the distribution curves in frequency of the low and thigh threshold voltages are shifted in the right direction, wherein broken line curves represent the low and high threshold voltage distribution curves of the conventional floating gate field effect transistor applied with the substrate voltage of the ground potential, whilst real line curves represent the low and high threshold voltage distribution curves of the novel floating gate field effect transistor applied with the back-bias or the negative substrate voltage in accordance with the present invention.

In accordance with the present invention, the substrate voltage applied to the substrate 1 or the p-well region 3 is negative, so that the control gate voltage Vg which has an intermediate level between the low and high levels shown in FIG. 6 is applied to the control gate electrode 8, whereby if the floating gate electrode 6 has been charged positively, then the floating gate field effect transistor turns ON, whilst if the floating gate electrode 8 has been charged negatively, then the floating gate field effect transistor turns OFF. As a result, binary digit data "0" and "1" are read out.

Figure 8A:
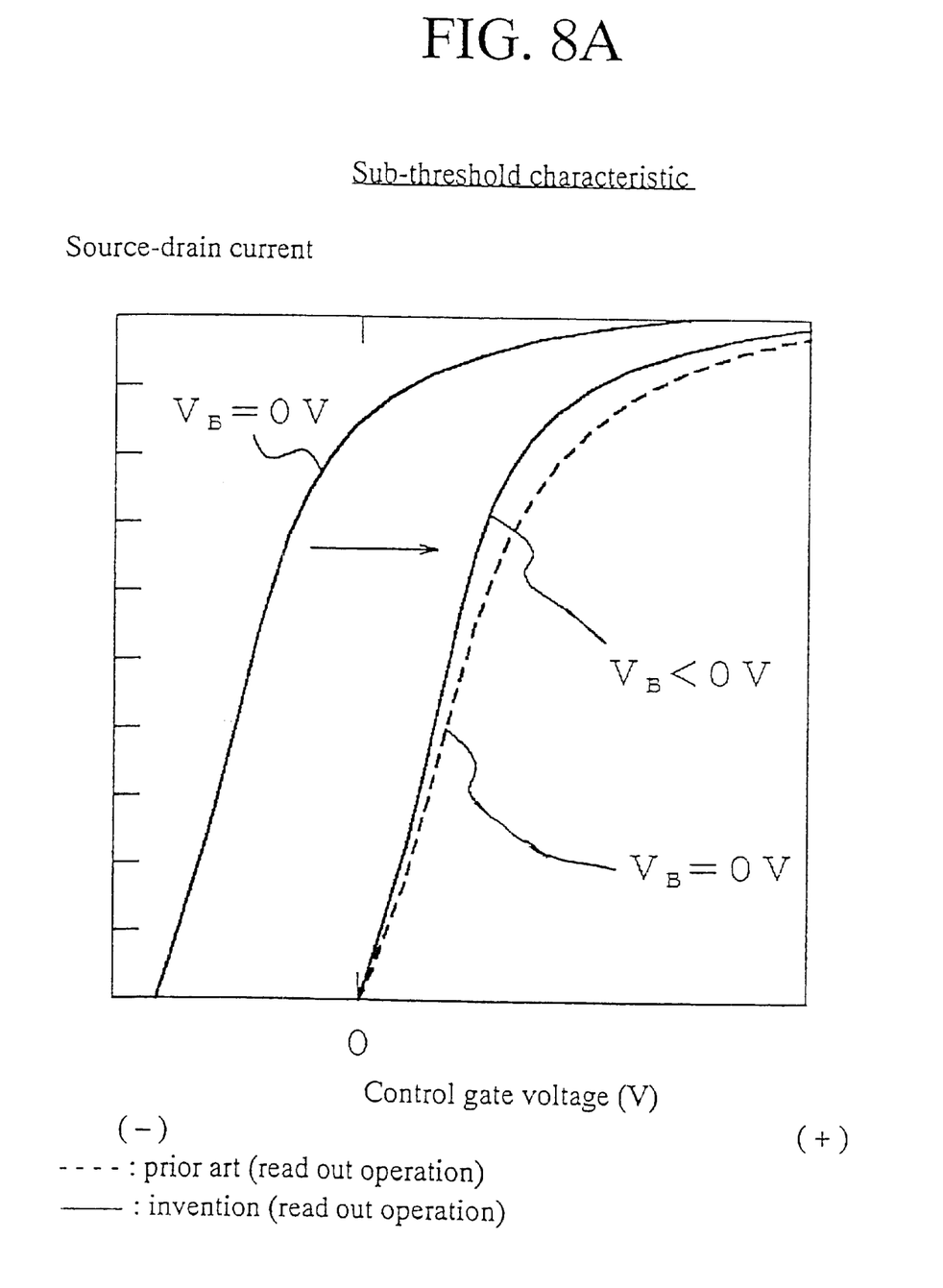
FIG. 8A is a diagram illustrative of variation in source-drain currents versus control gate voltage, after electrons have been discharged from the floating gate electrode and the binary digit data "0" is stored in the floating gate electrode, to explain a sub-threshold characteristic of the novel floating gate field effect transistor as compared to the sub-threshold characteristic of the conventional floating gate field effect transistor.
Figure 8B:
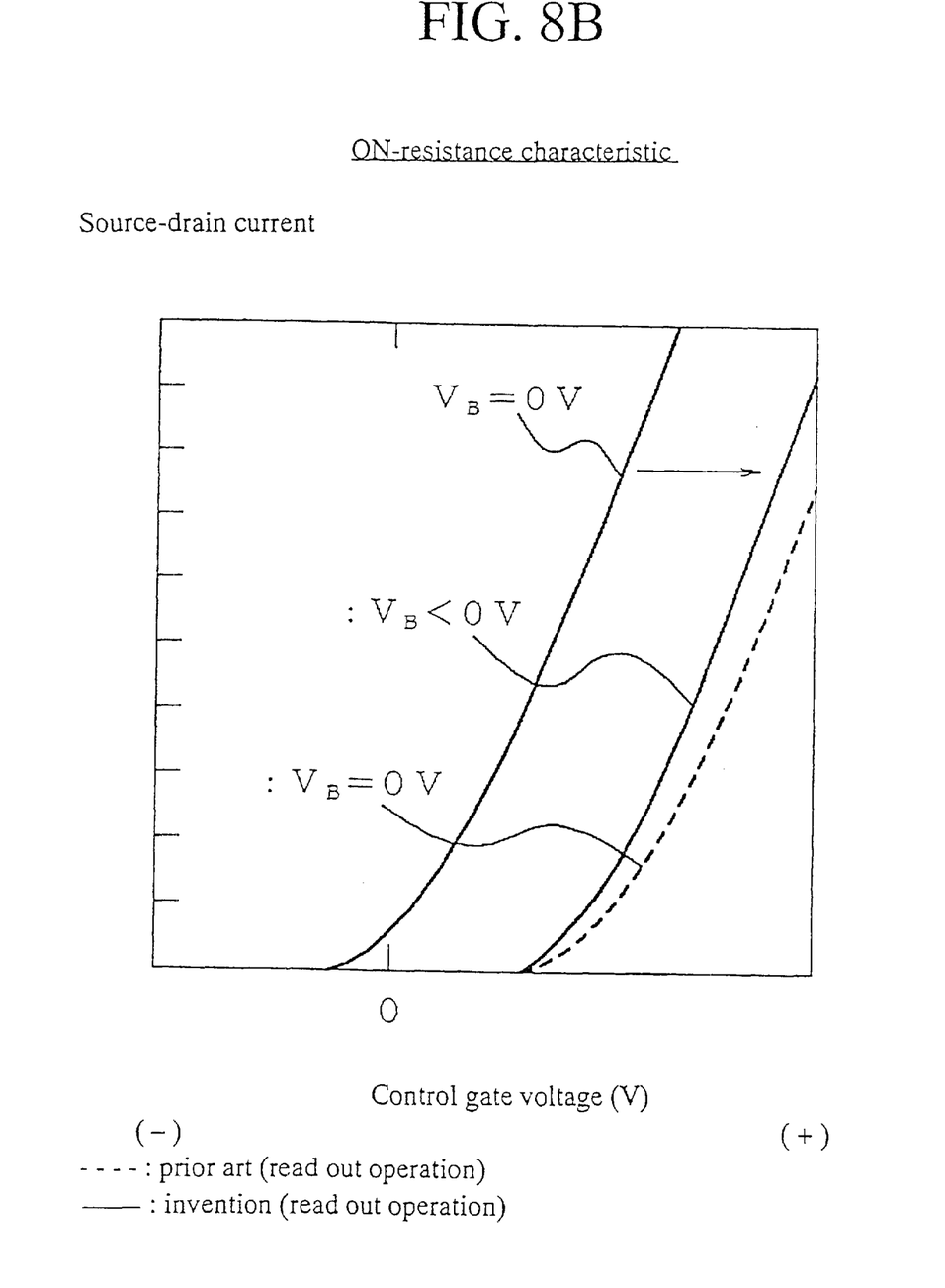
FIG. 8B is a diagram illustrative of variation in source-drain currents versus control gate voltage, after electrons have been discharged from the floating gate electrode and the binary digit data "0" is stored in the floating gate electrode, to explain an ON-characteristic of the novel floating gate field effect transistor as compared to the sub-threshold characteristic of the conventional floating gate field effect transistor.

The above novel floating gate field effect transistor is improved in driving ability and reduced in ON-resistance. FIG. 8A is a diagram illustrative of variation in source-drain currents versus control gate voltage, after electrons have been discharged from the floating gate electrode and the binary digit data "0" is stored in the floating gate electrode, to explain a sub-threshold characteristic of the novel floating gate field effect transistor as compared to the sub-threshold characteristic of the conventional floating gate field effect transistor. FIG. 8B is a diagram illustrative of variation in source-drain currents versus control gate voltage, after electrons have been discharged from the floating gate electrode and the binary digit data "0" is stored in the floating gate electrode, to explain an ON-characteristic of the novel floating gate field effect transistor as compared to the sub-threshold characteristic of the conventional floating gate field effect transistor.

As shown in FIG. 8A, the novel floating gate field effect transistor of the present invention is of the depletion type when the substrate voltage Vb of the substrate 1 or the p-well region 3 is 0V. By contrast to the present invention, the conventional floating gate field effect transistor is of the enhancement type when the substrate voltage Vb of the substrate 1 or the p-well region 3 is 0V. In accordance with the present invention, when the substrate voltage becomes negative or the back-bias voltage is applied to the substrate or the p-well region, the source-drain current curve is shifted in the narrow-marked positive direction as shown in FIGS. 8A and 8B. If the source-drain current curves of the novel and conventional floating gate field effect transistors become overlapped each other at the zero control gate voltage as shown in FIGS. 8A and 8B, then the gradient of the source-drain current curve or rising the sub-threshold characteristic of the novel floating gate field effect transistor is higher than the conventional floating gate field effect transistor. Namely, the source-drain current of the novel floating gate field effect transistor is higher than the conventional floating gate field effect transistor over the control gate voltage. In FIGS. 8A and 8B, the source-drain currents are represented by logarithmic scale. The novel and conventional floating gate field effect transistors are designed to have the same scale under the same conditions.

FIG. 8B is illustrative of the source-drain current curves over the control gate voltage when the floating gate field effect transistors are placed in the ON-state. The novel floating gate field effect transistor is higher in source-drain current over control gate voltage than the conventional floating gate field effect transistor. The novel floating gate field effect transistor is lower in ON-resistance than the conventional floating gate field effect transistor. FIG. 8B shows the dependencies of the source-drain current over the control gate voltage in the saturation regions of the novel and conventional floating gate field effect transistors.

The above described effects are caused by applying the back-bias to the substrate 1 or the p-well region 3 in the read-out operation in order to reduce a capacity of a space charge region in the substrate side. This reduction in capacity of the space charge region improves the driving ability of the floating gate field effect transistor and reduces the ON-resistance thereof.

The present invention allows a remarkable reduction in the number of the verify operations for the following reasons. As described above, the novel floating gate field effect transistor is improved in the driving ability, for which reason even the threshold voltage in the erasure operation varies toward the high level, then the read out speed remains the same as the conventional one. Even the variation in the threshold voltage after the erasure operation becomes large, then the required high read out operation speed of the novel floating gate field effect transistor is kept, whereby it is possible to reduce the number of the verifying operations.

The remarkable reduction in the number of the verifying operations causes a remarkable reduction in the necessary time for the erasure operation. It is also possible to reduce the number of the electron injections through the first gate insulation film into the floating gate electrodes for carrying out the verifying operations. The reduction in the number of the electron injections through the first gate insulation film into the floating gate electrodes causes a certain reduction in the damage that the first gate insulation film received. The reduction in the damage to the first gate insulation film improves the charge-holding characteristics and the write and erasure characteristics. As shown in FIG. 7, the distributions of the low and high threshold voltages of the novel floating gate field effect transistor are somewhat wider than the distributions of the low and high threshold voltages of the conventional floating gate field effect transistor. This means that the necessary number of the verifying operations for the novel floating gate field effect transistor is less than the necessary number of the verifying operations for the conventional floating gate field effect transistor.

In accordance with the above described embodiment, the erasure operation is carried out by discharging electrons from the floating gate electrode, whilst the write operation is carried out by injecting electrons to the floating gate electrode. It is, however, possible to obtain substantially the same effects as described above if the erasure operation is carried out by injecting electrons from the floating gate electrode, whilst the write operation is carried out by discharging electrons to the floating gate electrode.

As described above, the p-type low impurity concentration layer 4 is formed in the p-well region 3, wherein the p-type low impurity concentration layer 4 is lower in impurity concentration than the p-well region 3, so that a channel region is formed in the p-type low impurity concentration layer 4 when the novel floating gate field effect transistor turns ON. The novel floating gate field effect transistor is placed in the state of depletion type in an operation of discharging electrons from the floating gate electrode 6, and also the novel floating gate field effect transistor is applied with the back-bias for carrying out the read-out operation, so that the driving ability of the novel floating gate field effect transistor is improved and the ON-resistance of the novel floating gate field effect transistor is reduced. The improvement in the driving ability of the novel floating gate field effect transistor makes the driving ability of the novel floating gate field effect transistor more suitable for application to the advanced logic semiconductor devices. In the neutral state free of either electron discharge from the floating gate electrode or electron injection into the floating gate electrode, the novel floating gate field effect transistor is placed in the state of depletion type, whereby the holding characteristic for holding charges in the floating gate electrode is improved. Also cyclic characteristics of the electron discharge from the floating gate electrode and lectron injection into the floating gate electrode are improved.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of driving a floating gate field effect transistor having a floating gate electrode and a control gate electrode,
   wherein the floating gate field effect transistor is placed in a depletion type state for discharging electrons from the floating gate electrode,
   wherein the floating gate field effect transistor is applied with a back-bias for carrying out a read-out operation, and
   wherein the floating gate field effect transistor is placed in a depletion type state during a neutral state free of either electron discharge from the floating gate electrode or electron injection into the floating gate electrode.

2. A floating gate field effect transistor (FET), comprising:
   a substrate with a region of a first conductivity type and a first impurity concentration;
   a source and a drain of a second conductivity type spaced apart in said region at a surface thereof;
   a layer of the first conductivity type in said region at said surface of said region between said source and said drain, said layer having a second impurity concentration that is lower than the first impurity concentration, said layer being a channel when the FET is ON; and
   a floating gate electrode over said layer and a control gate electrode over said floating gate electrode.

3. The FET of claim 2, wherein the second impurity concentration is from $1/10$ to $1/100$ of the first impurity concentration.

4. The FET of claim 2, wherein said layer has a thickness of 100 to 300 nanometers.

5. The FET of claim 2, wherein said region comprises a semiconductor well region in a semiconductor substrate.

6. The FET of claim 2, wherein said layer extends an entire distance between said source and said drain.

7. The FET of claim 6, wherein the second impurity concentration is from $1/10$ to $1/100$ of the first impurity concentration.

8. The FET of claim 7, wherein said layer has a thickness of 100 to 300 nanometers.

9. The FET of claim 2, wherein the FET is adapted to be placed in a depletion state to discharge electrons from said floating gate.

10. A floating gate field effect transistor (FET), comprising:
    a substrate with a region of a first conductivity type and a first impurity concentration;
    a source and a drain of a second conductivity type spaced apart in said region at a surface thereof;
    a layer of the first conductivity type in said region at said surface of said region between said source and said drain, said layer having a second impurity concentration that is lower than the first impurity concentration, said layer being a channel when the FET is ON; and
    a floating gate electrode over said layer and a control gate electrode over said floating gate electrode,
    wherein the FET is adapted to receive a back-bias when conducting a read-out operation.

* * * * *